(12) United States Patent
Terayama

(10) Patent No.: US 10,696,127 B2
(45) Date of Patent: Jun. 30, 2020

(54) HIGH-VOLTAGE EQUIPMENT COOLING SYSTEM FOR ELECTRIC POWERED VEHICLES

(71) Applicant: HONDA MOTOR CO., LTD., Minato-ku, Tokyo (JP)

(72) Inventor: Shusei Terayama, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 25 days.

(21) Appl. No.: 16/084,258

(22) PCT Filed: Dec. 27, 2016

(86) PCT No.: PCT/JP2016/088962
§ 371 (c)(1),
(2) Date: Sep. 12, 2018

(87) PCT Pub. No.: WO2017/158991
PCT Pub. Date: Sep. 21, 2017

(65) Prior Publication Data
US 2019/0054795 A1 Feb. 21, 2019

(30) Foreign Application Priority Data

Mar. 16, 2016 (JP) .................. 2016-051825
Apr. 22, 2016 (JP) .................. 2016-085922

(51) Int. Cl.
*B60H 1/00* (2006.01)
*B60L 58/26* (2019.01)
(Continued)

(52) U.S. Cl.
CPC ........... *B60H 1/00392* (2013.01); *B60H 1/00* (2013.01); *B60H 1/00278* (2013.01);
(Continued)

(58) Field of Classification Search
CPC ............ B60H 1/00278; B60H 1/00392; B60H 1/00321; B60H 1/00328; B60H 1/00564;
(Continued)

(56) References Cited

U.S. PATENT DOCUMENTS

2013/0237138 A1   9/2013   Matsuda et al.
2014/0374081 A1*  12/2014  Kakehashi ............. B60K 11/02
                                                              165/202
(Continued)

FOREIGN PATENT DOCUMENTS

JP     4788540      10/2011
JP     2013-184562  9/2013

OTHER PUBLICATIONS

International Search Report and Written Opinion for International Application No. PCT/JP2016/088962 dated Mar. 14, 2017, 6 pages.

*Primary Examiner* — Tho V Duong
(74) *Attorney, Agent, or Firm* — Amin, Turocy & Watson, LLP

(57) ABSTRACT

Provided is a high-voltage equipment cooling system for electric-powered vehicles, which is capable of cooling high-voltage equipment (an IPU herein) at an optimum air flow rate without impairing the air-conditioning state of a vehicle interior. This high-voltage equipment cooling system is equipped with an IPU cooling ECU with a control unit, which controls the air flow rate of an IPU fan on the basis of information related to the air blowing method for the IPU, information related to the air flow rate of a blower fan, information related to the selection of inside air circulation mode or outside air introduction mode by an HVAC, information related to the selection of one of air blowing modes by the HVAC, and information related to the air flow rate to be supplied to the IPU.

4 Claims, 4 Drawing Sheets

(51) Int. Cl.
*B60K 11/06* (2006.01)
*H05K 7/20* (2006.01)
*B60L 3/00* (2019.01)
*B60H 1/32* (2006.01)

(52) U.S. Cl.
CPC ..... *B60H 1/00328* (2013.01); *B60H 1/00564* (2013.01); *B60H 1/00764* (2013.01); *B60H 1/00821* (2013.01); *B60H 1/3208* (2013.01); *B60K 11/06* (2013.01); *B60L 3/00* (2013.01); *B60L 58/26* (2019.02); *H05K 7/20* (2013.01); *H05K 7/20863* (2013.01); *H05K 7/20909* (2013.01); *H05K 7/20945* (2013.01); *B60H 2001/00614* (2013.01); *B60L 2210/10* (2013.01); *B60L 2240/545* (2013.01)

(58) Field of Classification Search
CPC .............. B60H 1/3208; B60H 1/00764; B60H 1/00821; B60H 1/00; B60H 2001/00614; H05K 7/20945; H05K 7/20863; H05K 7/20909; H05K 7/20; B60L 3/00; B60L 58/26; B60L 2210/10; B60L 2240/545
See application file for complete search history.

(56) References Cited

U.S. PATENT DOCUMENTS

| | | | |
|---|---|---|---|
| 2015/0273976 A1* | 10/2015 | Enomoto | B60K 6/22 165/202 |
| 2016/0059666 A1* | 3/2016 | Chen | F28F 9/00 62/238.7 |
| 2016/0159246 A1* | 6/2016 | Jung | B60K 1/04 62/243 |
| 2017/0028813 A1* | 2/2017 | Enomoto | B60H 1/24 |
| 2017/0197488 A1* | 7/2017 | Kim | H01M 10/625 |

* cited by examiner

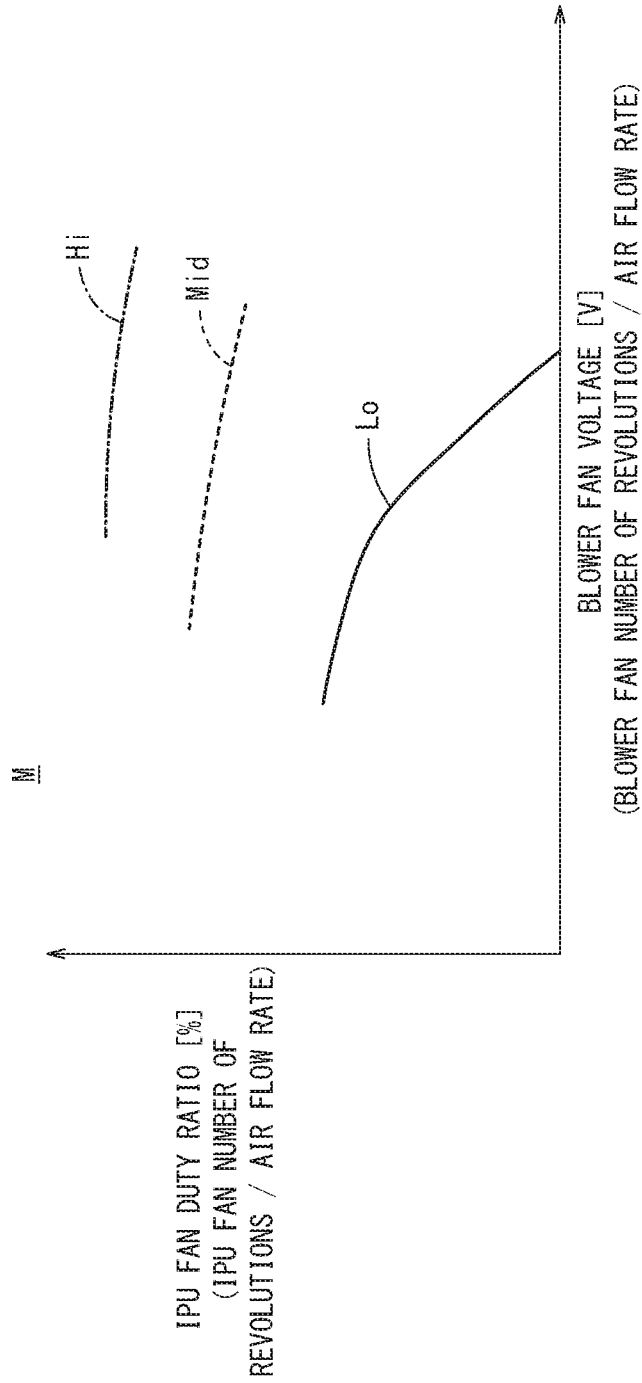

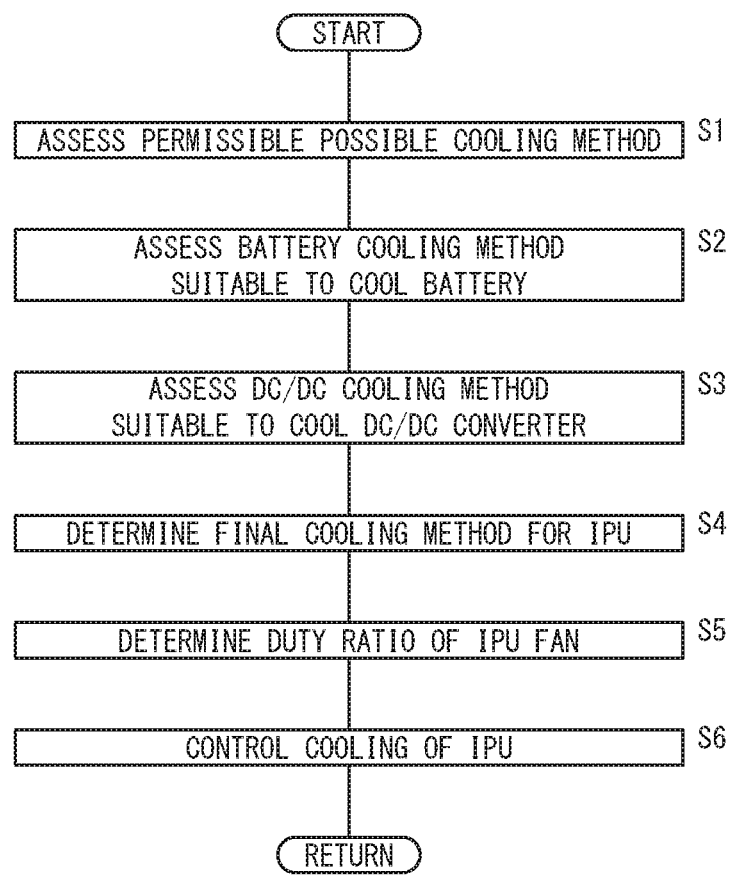

HIGH-VOLTAGE EQUIPMENT COOLING SYSTEM FOR ELECTRIC POWERED VEHICLES

TECHNICAL FIELD

The present invention relates to a high-voltage equipment cooling system for an electric vehicle (electric-powered vehicles), configured to cool high-voltage equipment such as a high-voltage battery that supplies power to a drive motor for an electric vehicle and a DC/DC converter that steps down the voltage of a battery to apply the voltage to low-voltage equipment.

BACKGROUND ART

Electric vehicles (hereinafter simply referred to as vehicles), for example, electric-powered automobiles, hybrid vehicles, range extender vehicles, and fuel cell vehicles, each include a drive motor and a battery that supplies power to the motor. Such a vehicle further includes a DC/DC converter that steps down the voltage of the battery to apply the voltage to an air conditioner, various ECUs, and other units. High-voltage equipment such as the battery and the DC/DC converter generates heat according to travel load, and the performance changes in response to changes in temperature. This creates the need for temperature control, in particular, cooling, of the high-voltage equipment. Various documents describe temperature control of high-voltage equipment.

Japanese Laid-Open Patent Publication No. 2013-184562 discloses a system capable of supplying air inside or outside a vehicle cabin to an IPU (Intelligent Power Unit) including high-voltage equipment. The system has a configuration including the IPU and an air conditioner (HVAC) directly connected via a high-voltage fan, and operates the high-voltage fan to supply air cooled by an evaporator to the IPU.

Japanese Patent No. 4788540 discloses a system including a conditioned air generating unit composed of, for example, a Peltier element as an air conditioner, a first fan that supplies air into a seat, and a second fan that supplies air to an energy storage device, the fans being disposed downstream of the conditioned air generating unit. The system determines the air flow rate of the second fan in response to an air conditioning request to the second fan with the sum of the air flow rate of the first fan and the air flow rate of the second fan being maintained at the maximum air flow rate or below while higher priority is given to the air supply into the seat. According to the system, the temperature of the energy storage device is controlled while the comfort of occupants is ensured even when the air conditioning performance is limited.

SUMMARY OF INVENTION

Air channels formed inside an air conditioner (HVAC) that controls the air conditioning state of a vehicle cabin change, according to settings of, for example, air introduction method (indoor air circulation or outdoor air introduction) and air supply mode (air outlets). Different channels have different air pressure losses. During temperature control of high-voltage equipment, controlling the air flow rate without consideration of the amount of pressure loss may hinder an appropriate temperature control. For example, when the pressure loss is large, there is a concern that the required air flow rate may not be achieved, and that the high-voltage equipment may not be cooled sufficiently. On the other hand, when the pressure loss is small, there is a concern that air may be supplied more than necessary, and that the high-voltage equipment may be overcooled.

The present invention has been devised taking into consideration such problems, and has the object of providing a high-voltage equipment cooling system for an electric vehicle, which is capable of cooling high-voltage equipment at an optimum air flow rate without degrading the air conditioning state inside a vehicle cabin.

A high-voltage equipment cooling system for an electric vehicle according to the present invention, equipped with high-voltage equipment disposed in the electric vehicle driven by a motor, an air conditioner including an air cooling unit that cools air, a first air blower configured to supply air to the air conditioner, and a second air blower configured to supply air to the high-voltage equipment, includes a control unit configured to control an air flow rate of the second air blower based on information about an air supply method for the high-voltage equipment, information about an air flow rate of the first air blower, selection information about which of indoor air circulation and outdoor air introduction is selected by the air conditioner, selection information about which air supply mode is selected by the air conditioner, and information about an air flow rate at which air is supplied to the high-voltage equipment. The present invention controls the air flow rate of the second air blower based on the information about the air flow rate of the first air blower. This enables air to be supplied to the high-voltage equipment without degrading the air conditioning state inside a vehicle cabin. Furthermore, the air flow rate of the second air blower is controlled based on the selection information about which of the indoor air circulation and the outdoor air introduction is selected by the air conditioner and the selection information about which air supply mode is selected by the air conditioner. Thus, pressure loss in a channel is calculated to supply air to the high-voltage equipment. Therefore, the high-voltage equipment is cooled at an optimum air flow rate without degrading the air conditioning state inside the vehicle cabin.

In the present invention, the control unit may be configured to use a map associating the air flow rate of the first air blower with the air flow rate of the second air blower for each air supply mode corresponding to the indoor air circulation and for each air supply mode corresponding to the outdoor air introduction and may be configured to determine the air flow rate of the second air blower based on the air flow rate of the first air blower and the map. According to the configuration above, the map that associates the air flow rate of the first air blower with the air flow rate of the second air blower for each air supply mode corresponding to the indoor air circulation and for each air supply mode corresponding to the outdoor air introduction is used. This enables the high-voltage equipment to be cooled at an air flow rate corresponding to the pressure loss in each air supply mode.

In the present invention, a voltage sensor configured to detect a voltage of the first air blower may further be included, and the control unit may be configured to interpret the voltage detected by the voltage sensor as the air flow rate of the first air blower. According to the configuration above, the voltage of the first air blower is interpreted as the air flow rate of the first air blower. This enables the air flow rate of the first air blower to be detected with a simple configuration.

In the present invention, the information about the air supply method for the high-voltage equipment may be either supply of air cooled by the air conditioner or supply of air inside a vehicle cabin. According to the configuration above, the air supply method, i.e., A/C cooling or normal cooling, for the high-voltage equipment is selected, allowing the high-voltage equipment to be cooled appropriately.

According to the present invention, the high-voltage equipment is cooled at an optimum air flow rate without degrading the air conditioning state inside the vehicle cabin.

BRIEF DESCRIPTION OF DRAWINGS

FIG. 3 is a map stored in a storage unit; and

FIG. 4 is a flow chart of a process performed by the high-voltage equipment cooling system.

DESCRIPTION OF EMBODIMENT

A preferred embodiment of the present invention will be exemplified and described in detail below with reference to the accompanying drawings. A high-voltage equipment cooling system according to the present embodiment is provided for an electric vehicle including a motor for traveling. The electric vehicle includes electric-powered automobiles, hybrid vehicles, range extender vehicles, and fuel cell vehicles.

1. SYSTEM CONFIGURATION

Figure 1:
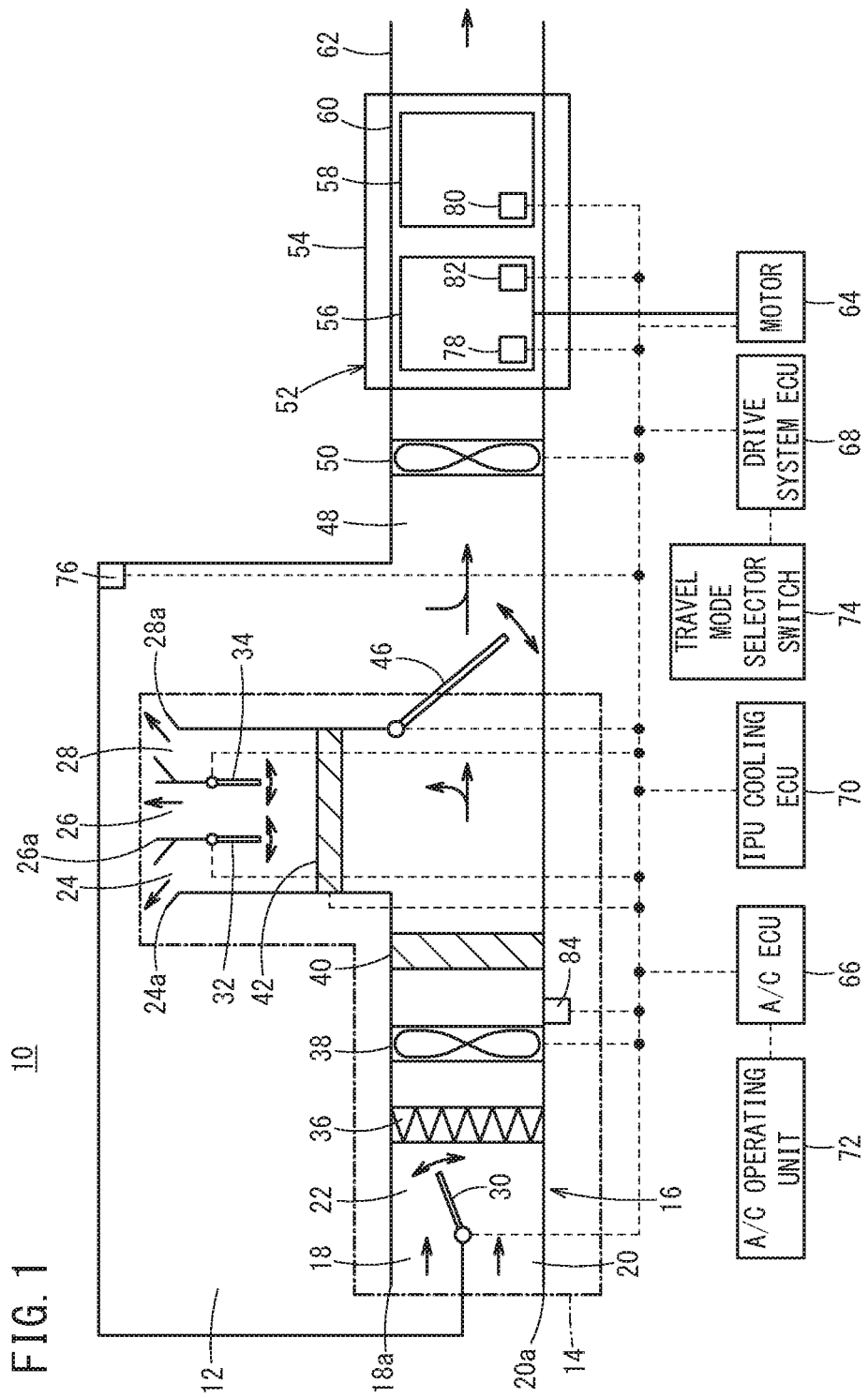
FIG. 1 is a system configuration diagram of a high-voltage equipment cooling system.

The system configuration of a high-voltage equipment cooling system 10 according to the present embodiment will now be described with reference to FIG. 1. FIG. 1 schematically illustrates the system configuration of the high-voltage equipment cooling system 10. The high-voltage equipment cooling system 10 includes an HVAC 14, an IPU fan 50, an IPU 52, a motor 64, an air conditioner ECU 66 (also referred to as A/C ECU 66), a drive system ECU 68, and an IPU cooling ECU 70. The high-voltage equipment cooling system 10 causes the HVAC 14 and the IPU fan 50 to cooperate with each other to cool the IPU 52.

The HVAC (Heating, Ventilation, and Air Conditioning) 14 is an air conditioning unit that conditions air inside a vehicle cabin 12, and includes a channel 16, a filter 36, a blower fan 38, an evaporator 40, and a heater 42. The channel 16 includes an indoor air circulation channel 18 through which air inside the vehicle cabin 12 is taken in, an outdoor air introduction channel 20 through which outdoor air is taken in, a common channel 22 connected with the indoor air circulation channel 18 and the outdoor air introduction channel 20, and a first air channel 24, a second air channel 26, and a third air channel 28 connected with the common channel 22. The channel 16 further includes a first switching door 30, a second switching door 32, and a third switching door 34 that open and close in response to operations of actuators (not illustrated).

The first switching door 30 opens one channel 16 of the indoor air circulation channel 18 and the outdoor air introduction channel 20 with respect to the common channel 22, and closes the other channel 16 with respect to the common channel 22. The second switching door 32 and the third switching door 34 work together to open or close the common channel 22 with respect to the first air channel 24, the second air channel 26, and the third air channel 28.

The indoor air circulation channel 18 communicates with an air inlet 18a disposed inside the vehicle cabin 12. The outdoor air introduction channel 20 communicates with an air inlet 20a disposed outside the vehicle cabin 12. The first air channel 24, the second air channel 26, and the third air channel 28 each communicate with a separate air outlet disposed inside the vehicle cabin 12. For example, the first air channel 24 communicates with an air outlet 24a facing an upper portion of the driver's seat. The second air channel 26 communicates with an air outlet 26a facing a foot area of the driver's seat. The third air channel 28 communicates with an air outlet 28a facing a windshield.

The common channel 22 is provided with the filter 36, the blower fan 38, the evaporator 40, and the heater 42. The filter 36 filters the air taken in from the indoor air circulation channel 18 or the outdoor air introduction channel 20 and provides the air downstream. The blower fan 38 provides the air filtered by the filter 36 downward. The evaporator 40 cools the air supplied from the blower fan 38 and provides the air downstream. The heater 42 heats the air cooled by the evaporator 40 and provides the air downstream.

An IPU air duct 48 is provided outside the HVAC 14. One end of the IPU air duct 48 is directly connected with the common channel 22 downstream of the evaporator 40 and the vehicle cabin 12, and the other end of the IPU air duct 48 is directly connected with an IPU channel 60 of the IPU 52. An IPU cooling switching door 46 opens either the common channel 22 of the HVAC 14 or the vehicle cabin 12 with respect to the IPU air duct 48 and closes the other with respect to the IPU air duct 48 in response to operations of an actuator (not illustrated).

The IPU air duct 48 is provided with the IPU fan 50. The IPU fan 50 provides the air in the common channel 22 of the HVAC 14 or the vehicle cabin 12 downstream (toward the IPU 52). The IPU 52 includes a battery 56 and a DC/DC converter 58 inside a case 54. The battery 56 supplies electricity to the motor 64 that drives the electric vehicle. The DC/DC converter 58 steps down the voltage of the battery 56 to a predetermined voltage and outputs the voltage to various types of electrical equipment (such as the ECUs 66, 68, 70). The battery 56 and the DC/DC converter 58 are high-voltage equipment, and the ECUs 66, 68, 70 and the like are low-voltage equipment. The IPU channel 60 that passes air is formed inside the case 54 of the IPU 52, and the air passing through the IPU channel 60 is supplied to the battery 56 and the DC/DC converter 58. The battery 56 is disposed upstream in the IPU channel 60, and the DC/DC converter 58 is disposed downstream in the IPU channel 60. The IPU channel 60 is connected with a discharge duct 62. The discharge duct 62 discharges the air discharged from the IPU channel 60 to the inside of the vehicle.

A "cooling method" used below refers to a method of cooling the IPU 52 and is defined by an "air flow rate", an "air supply method", and other parameters. The "air supply method" indicates either "A/C cooling" or "normal cooling". The "A/C cooling" refers to an air supply method in which the IPU cooling switching door 46 directly connects the channel 16 of the HVAC 14 and the IPU air duct 48 to supply the air cooled by the HVAC 14 to the IPU 52. The "normal cooling" refers to an air supply method in which the IPU cooling switching door 46 directly connects the vehicle cabin 12 and the IPU air duct 48 to supply the air in the vehicle cabin 12 to the IPU 52.

The high-voltage equipment cooling system 10 includes the three ECUs, i.e., the air conditioner ECU 66, the drive system ECU 68, and the IPU cooling ECU 70. Each of the ECUs 66, 68, 70 is a calculator including a microcomputer and includes a CPU, a ROM (including an EEPROM), a RAM, input/output units such as an A/D converter and a D/A converter, a timer as a time measuring unit, and the like.

Each of the ECUs 66, 68, 70 functions as various function performing units (function performing means) such as a control unit, a computation unit, and a processing unit when the CPU reads out and executes programs stored in the ROM. Each of the ECUs 66, 68, 70 may include only one ECU or may include a plurality of ECUs.

The A/C ECU 66 controls the operating state of the HVAC 14 according to the settings of an A/C operating unit 72 disposed inside the vehicle cabin 12. An occupant including the driver operates the A/C operating unit 72 to set the temperature inside the vehicle cabin 12, the level of the air flow rate, the channel 16 for indoor air circulation or outdoor air introduction, an air supply mode, and the like. The air supply mode refers to the air supply position to which air is sent in the vehicle cabin 12. The A/C ECU 66 controls the switching operation of the first switching door 30 of the HVAC 14 to switch between the indoor air circulation and the outdoor air introduction. Moreover, the A/C ECU 66 controls the switching operation of the second switching door 32 and the third switching door 34 of the HVAC 14 to switch the air supply position. Furthermore, the A/C ECU 66 controls the number of revolutions of the blower fan 38 to adjust the air flow rate. In addition, the A/C ECU 66 controls the temperature of the heater 42 to adjust the temperature of the air to be sent.

The drive system ECU 68 controls drive systems such as the motor 64. For example, the drive system ECU 68 controls the motor 64 according to the travel mode set by a travel mode selector switch 74 disposed inside the vehicle cabin 12 while controlling the motor 64 in response to operations of, for example, an accelerator pedal (not illustrated). The driver operates the travel mode selector switch 74 to set the travel mode. The travel mode includes, for example, a mode with quick acceleration or responsiveness, and a fuel efficient mode. Loads on the battery 56 and the DC/DC converter 58 vary depending on the travel mode. In the present embodiment, a high-load mode, a medium-load mode, and a low-load mode are set for the purpose of illustration.

The IPU cooling ECU 70 controls the number of revolutions of the IPU fan 50 and the switching operation of the IPU cooling switching door 46 to cool the IPU 52 effectively. Moreover, the IPU cooling ECU 70 outputs commands to the A/C ECU 66 to control the HVAC 14. The details of the IPU cooling ECU 70 will be described below.

The high-voltage equipment cooling system 10 includes various sensors. The high-voltage equipment cooling system 10 here includes a cabin temperature sensor 76 that detects the temperature inside the vehicle cabin 12, a battery temperature sensor 78 that detects the temperature of the battery 56, a DC/DC temperature sensor 80 that detects the temperature of the DC/DC converter 58, a battery current sensor 82 that detects the electric current of the battery 56, and a blower fan voltage sensor 84 that detects the voltage of the blower fan 38.

2. IPU COOLING ECU 70

Figure 2:
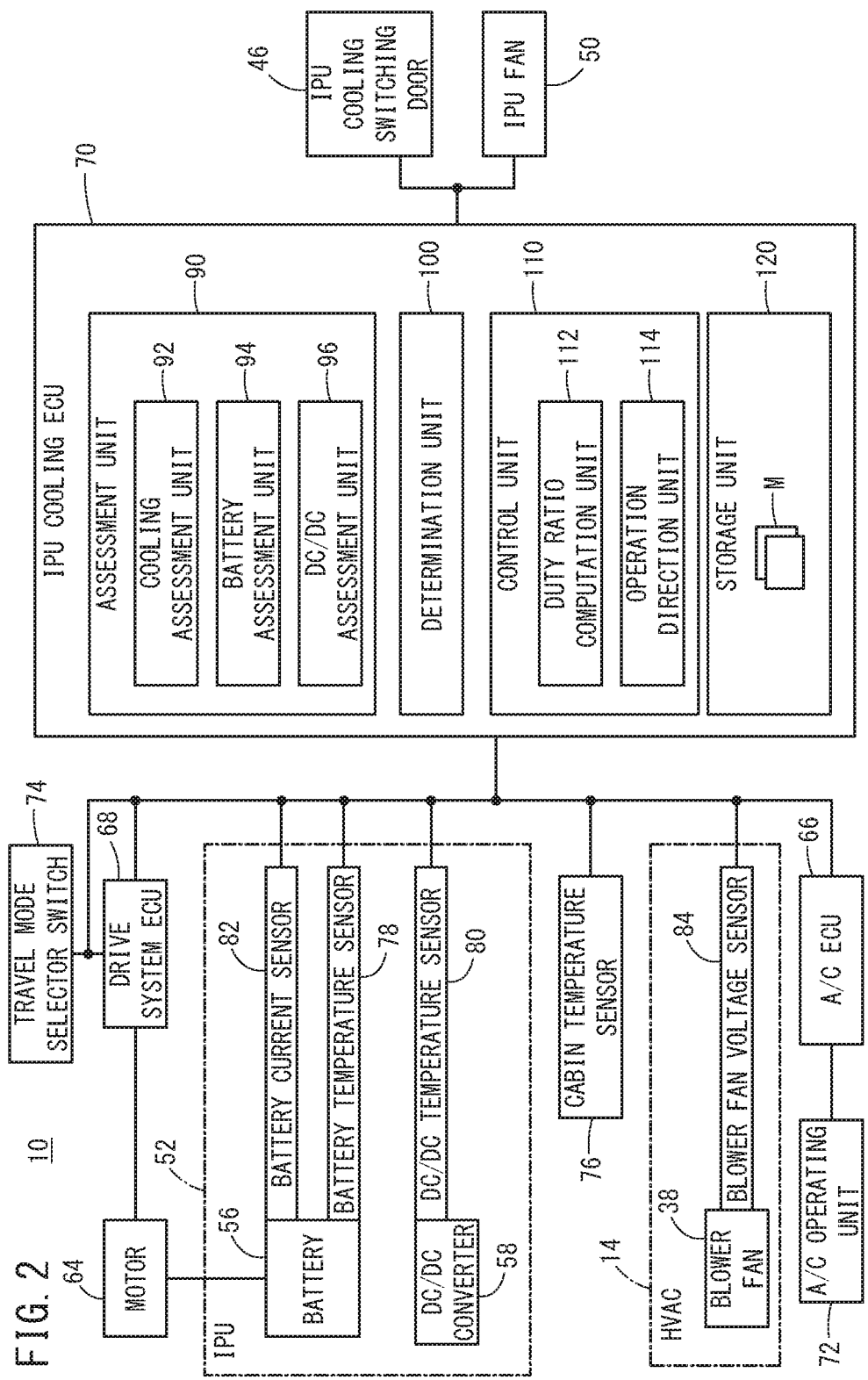
FIG. 2 is a block diagram of the high-voltage equipment cooling system.

Functions of the IPU cooling ECU 70 will now be described with reference to FIG. 2. The IPU cooling ECU 70 functions as an assessment unit 90, a determination unit 100, and a control unit 110. The assessment unit 90 functions as a cooling assessment unit 92, a battery assessment unit 94, and a DC/DC assessment unit 96. The control unit 110 functions as a duty ratio computation unit 112 and an operation direction unit 114. The IPU cooling ECU 70 also includes a storage unit 120.

The cooling assessment unit 92 assesses a possible cooling method that is permissible based on the travel mode set for the electric vehicle and the air conditioning state inside the vehicle cabin 12. The possible cooling method assessed by the cooling assessment unit 92 indicates the air flow rate that can be provided to cool the IPU 52 while higher priority is given to the air conditioning state inside the vehicle cabin 12, i.e., the air conditioning state set by the A/C operating unit 72. Here, in addition to two air flow rates (Hi: high or Lo: low), rejection of cooling and failure of the HVAC 14 are set as options for the possible cooling method, and one of these is to be selected. Giving higher priority to the air conditioning state set by the A/C operating unit 72 ensures the air conditioning state inside the vehicle cabin 12 required by the occupant without any influence from the cooling of the IPU 52.

The battery assessment unit 94 assesses a battery cooling method suitable to cool the battery 56 based on the temperature of and the amount of heat generated by the battery 56. The battery cooling method indicates the air flow rate and the air supply method required to cool the battery 56. Here, two air supply methods (A/C cooling and normal cooling) and three air flow rates (Hi: high, Mid: medium, or Lo: low) are set as options for the battery cooling method. In addition, an option of no cooling needed is also set.

The DC/DC assessment unit 96 assesses a DC/DC cooling method suitable to cool the DC/DC converter 58 based on the temperature of the DC/DC converter 58. The DC/DC cooling method indicates the air flow rate and the air supply method required to cool the DC/DC converter 58. Here, one air supply method (normal cooling) and three air flow rates (Hi: high, Mid: medium, or Lo: low) are set as options for the DC/DC cooling method. In addition, an option of no cooling needed is also set.

The determination unit 100 determines a final cooling method for the IPU 52 based on the assessment result produced by the cooling assessment unit 92, the assessment result produced by the battery assessment unit 94, and the assessment result produced by the DC/DC assessment unit 96. The final cooling method indicates the air flow rate and the air supply method required to cool the IPU 52. The determination unit 100 selects the higher of the air flow rate selected by the battery assessment unit 94 and the air flow rate selected by the DC/DC assessment unit 96 basically with the possible cooling method (air flow rate) selected by the cooling assessment unit 92 as the upper limit. However, there may be some exceptions. Further, the travel mode may be used as the basis for the assessment.

The duty ratio computation unit 112 determines the duty ratio of the IPU fan 50 (the duty ratio of a motor of the IPU fan 50) corresponding to the air flow rate of the IPU fan 50. For determination, the duty ratio computation unit 112 uses information about the air supply method (A/C cooling or normal cooling) for the IPU 52 determined by the determination unit 100, information about the air flow rate of the blower fan 38, selection information about which of the indoor air circulation and the outdoor air introduction is selected by the HVAC 14, selection information about which air supply mode is selected by the HVAC 14, information about the air flow rate at which air is supplied to the IPU 52 determined by the determination unit 100, and the like. The air flow rate of the IPU fan 50 is determined based on, for example, a map M as illustrated in FIG. 3.

The map M illustrates the correspondence relationship between the voltage of the blower fan 38 and the duty ratio of the IPU fan 50. The voltage of the blower fan 38 and the air flow rate (number of revolutions) of the blower fan 38 are in proportion. Moreover, the duty ratio of the IPU fan 50 and the air flow rate (number of revolutions) of the IPU fan 50 are in proportion. Thus, in the present embodiment, the voltage of the blower fan 38 is regarded as the air flow rate (number of revolutions) of the blower fan 38, and the duty ratio of the IPU fan 50 is regarded as the air flow rate (number of revolutions) of the IPU fan 50. That is, it can be said that the map M indicates the correspondence relationship between the air flow rate (number of revolutions) of the blower fan 38 and the air flow rate (number of revolutions) of the IPU fan 50. The map M is provided for each air supply method (A/C cooling or normal cooling) for the IPU 52, each of the indoor air circulation and the outdoor air introduction selected by the HVAC 14, and each air supply mode of the HVAC 14. Furthermore, each map M includes the correspondence relationship between the voltage of the blower fan 38 and the duty ratio of the IPU fan 50 set for each air flow rate (Lo, Mid, or Hi) at which air is supplied to the IPU 52. The pressure loss in the channel 16 formed in the HVAC 14 during the indoor air circulation and the pressure loss in the channel 16 formed in the HVAC 14 during the outdoor air introduction differ from each other. Similarly, the pressure loss in the channel 16 formed in the HVAC 14 varies for each air supply mode. Thus, each map M is created after calculating the differences in the pressure loss. Each map M is stored in the storage unit 120.

The operation direction unit 114 outputs operation directions to drivers (not illustrated) of the IPU fan 50 and the IPU cooling switching door 46 based on the result determined by the determination unit 100 or the duty ratio computation unit 112.

3. OPERATIONS OF HIGH-VOLTAGE EQUIPMENT COOLING SYSTEM 10

Operations of the high-voltage equipment cooling system 10 will now be described with reference to FIG. 4. The operations below are periodically performed mainly by the IPU cooling ECU 70.

In step S1, the cooling assessment unit 92 assesses the possible cooling method that is permissible at the moment. The cooling assessment unit 92 assesses the possible cooling method that is permissible based on the travel mode set for the drive system ECU 68, the operating state of the HVAC 14 controlled by the A/C ECU 66, and the temperature detected by the cabin temperature sensor 76. Here, the air flow rate that is permissible is selected from either of the air flow rates (Hi: high or Lo: low) while higher priority is given to the maintenance of the air conditioning state inside the vehicle cabin 12. In a case where the air conditioning state inside the vehicle cabin 12 cannot be maintained by cooling the IPU 52, the cooling assessment unit 92 selects the option (possible cooling method) of rejection. Moreover, in a case where the HVAC 14 is broken, the option (possible cooling method) of failure is selected.

In step S2, the battery assessment unit 94 assesses the battery cooling method suitable to cool the battery 56. The battery 56 increases in output in the temperature range of about 20° C. to 50° C. To bring the temperature of the battery 56 into the temperature range or less, the battery assessment unit 94 selects the optimum air flow rate (Hi: high, Mid: medium, or Lo: low) along with the optimum air supply method (A/C cooling or normal cooling) based on the temperature of the battery 56 detected by the battery temperature sensor 78, the current value of the battery 56 detected by the battery current sensor 82, the travel mode selected by the travel mode selector switch 74, and the like.

At this moment, the air flow rate is increased as a difference between the temperature of the battery 56 and the above-described temperature range increases. However, in a case where the difference is larger than a predetermined value, it is conceivable that the temperature of the vehicle cabin 12 is also increased. Thus, cooling of the interior of the vehicle cabin 12 may be given higher priority, and the air flow rate may be set to low. In a case where the temperature of the battery 56 is already in the temperature range or less, the option (battery cooling method) of no cooling needed (normal method or halt of the IPU fan 50) is selected.

In step S3, the DC/DC assessment unit 96 assesses the DC/DC cooling method suitable to cool the DC/DC converter 58. The DC/DC converter 58 increases in efficiency in the temperature range of about 70° C. to 80° C. To bring the temperature of the DC/DC converter 58 into the temperature range or less, the DC/DC assessment unit 96 selects the optimum air flow rate (Hi: high, Mid: medium, or Lo: low) along with the air supply method (normal cooling) based on the temperature of the DC/DC converter 58 detected by the DC/DC temperature sensor 80 and the like. At this moment, the air flow rate is increased with increasing difference between the temperature of the DC/DC converter 58 and the above-described temperature range. However, in a case where the difference is larger than a predetermined value, it is conceivable that the temperature of the vehicle cabin 12 is also increased. Thus, cooling of the interior of the vehicle cabin 12 may be given higher priority, and the air flow rate may be set to low. In a case where the temperature of the DC/DC converter 58 is already in the temperature range or less, the option (DC/DC cooling method) of no cooling needed (normal cooling or halt of the IPU fan 50) is selected.

In step S4, the determination unit 100 determines the final cooling method for the IPU 52 based on the assessment results produced in steps S1 to S3. The determination unit 100 selects the higher of the air flow rate selected by the battery assessment unit 94 and the air flow rate selected by the DC/DC assessment unit 96 with the air flow rate selected by the cooling assessment unit 92 as the upper limit. For example, in a case where the air flow rate selected by the cooling assessment unit 92 is high and the air flow rate selected by the battery assessment unit 94 or the DC/DC assessment unit 96 is medium or high, the determination unit 100 selects the medium or high air flow rate. Moreover, in a case where the air supply method selected by the battery assessment unit 94 is A/C cooling, the determination unit 100 selects the air supply method of A/C cooling, and in a case where the air supply method selected by the battery assessment unit 94 is normal cooling, the determination unit 100 selects the air supply method of normal cooling.

However, there may be some exceptions. In a case where the air flow rate selected by the cooling assessment unit 92 is low and the air flow rate selected by the battery assessment unit 94 or the DC/DC assessment unit 96 is high or medium, the determination unit 100 selects the air supply method of normal cooling and the high or medium air flow rate as the final cooling method. At this moment, the normal cooling is selected even when the air supply method selected by the battery assessment unit 94 is the A/C cooling. Moreover, in a case where the cooling assessment unit 92 selects rejection of cooling or failure of the HVAC 14, or in a case where the battery assessment unit 94 or the DC/DC assessment unit 96 selects no cooling needed, the determination unit 100 selects the air supply method of normal cooling and the low air flow rate as the final cooling method.

In step S5, the duty ratio computation unit 112 determines the duty ratio of the IPU fan 50. The duty ratio computation unit 112 assesses which of the indoor air circulation and the outdoor air introduction is selected based on the operating state selected by the A/C ECU 66, and further assesses the air supply mode. The duty ratio computation unit 112 then determines the map M (FIG. 3) to be used from the maps M stored in the storage unit 120 based on the assessment results and the information about the air supply method (A/C cooling or normal cooling) determined in step S4. Next, the duty ratio computation unit 112 determines the characteristic (one of the characteristics Lo, Mid, and Hi) to be used from the determined map M based on the air flow rate determined in step S4. The duty ratio computation unit 112 then determines the duty ratio (air flow rate) of the IPU fan 50 from the determined characteristic and the voltage of the blower fan 38 detected by the blower fan voltage sensor 84.

In step S6, the operation direction unit 114 performs cooling control of the IPU 52. The operation direction unit 114 outputs an operation direction to the driver of the IPU fan 50 based on the duty ratio (air flow rate) determined in step S5. The driver follows the operation direction to operate the motor of the IPU fan 50. This adjusts the number of revolutions of the IPU fan 50 and optimizes the air flow rate. Moreover, the operation direction unit 114 outputs an operation direction to the driver of the IPU cooling switching door 46 based on the air supply method determined in step S4. In a case where A/C cooling is selected in step S4, the IPU cooling switching door 46 opens the common channel 22 of the HVAC 14 with respect to the IPU air duct 48 while closing the vehicle cabin 12 with respect to the IPU air duct 48. On the other hand, in a case where normal cooling is selected in step S4, the IPU cooling switching door 46 opens the vehicle cabin 12 with respect to the IPU air duct 48 while closing the common channel 22 of the HVAC 14 with respect to the IPU air duct 48.

4. CONCLUSION

The high-voltage equipment cooling system 10 includes the IPU 52 (high-voltage equipment) disposed in the electric vehicle driven by the motor 64, the HVAC 14 (air conditioner) including the evaporator 40 (air cooling unit) that cools air, the blower fan 38 (first air blower) configured to supply air to the HVAC 14, and the IPU fan 50 (second air blower) configured to supply air to the IPU 52. The high-voltage equipment cooling system 10 further includes the IPU cooling ECU 70. The IPU cooling ECU 70 includes the control unit 110 configured to control the air flow rate of the IPU fan 50 based on the information about the air supply method for the IPU 52, the information about the air flow rate of the blower fan 38, the selection information about which of the indoor air circulation and the outdoor air introduction is selected by the HVAC 14, the selection information about which air supply mode is selected by the HVAC 14, and the information about the air flow rate at which air is supplied to the IPU 52.

The IPU cooling ECU 70 controls the air flow rate of the IPU fan 50 based on the information about the air flow rate of the blower fan 38, i.e., the voltage of the blower fan 38. This enables air to be supplied to the IPU 52 without degrading the air conditioning state inside the vehicle cabin 12. Furthermore, the IPU cooling ECU 70 controls the air flow rate of the IPU fan 50 based on the selection information about which of the indoor air circulation and the outdoor air introduction is selected by the HVAC 14 and the selection information about which air supply mode is selected by the HVAC 14. Thus, the pressure loss in the channel 16 inside the HVAC 14 is calculated to supply air to the IPU 52.

Therefore, the IPU 52 is cooled at an optimum air flow rate without degrading the air conditioning state inside the vehicle cabin 12.

The control unit 110 is configured to use a map M that associates the voltage (air flow rate) of the blower fan 38 with the duty ratio (air flow rate) of the IPU fan 50 for each air supply mode corresponding to the indoor air circulation and for each air supply mode corresponding to the outdoor air introduction. The control unit 110 is then configured to determine the duty ratio (air flow rate) of the IPU fan 50 based on the voltage (air flow rate) of the blower fan 38 and the map M. According to this configuration, the map M that associates the voltage (air flow rate) of the blower fan 38 with the duty ratio (air flow rate) of the IPU fan 50 for each air supply mode corresponding to the indoor air circulation and for each air supply mode corresponding to the outdoor air introduction is used. This enables the IPU 52 to be cooled at an air flow rate corresponding to the pressure loss in each air supply mode.

The high-voltage equipment cooling system 10 further includes the blower fan voltage sensor 84 configured to detect the voltage of the blower fan 38. The control unit 110 is configured to interpret the voltage detected by the blower fan voltage sensor 84 as the air flow rate of the blower fan 38. According to this configuration, the voltage of the blower fan 38 is interpreted as the air flow rate of the blower fan 38. This enables the air flow rate of the blower fan 38 to be detected with a simple configuration.

The information about the air supply method for the IPU 52 may be either the supply of the air cooled by the HVAC 14 or the supply of the air inside the vehicle cabin 12. According to this configuration, the air supply method, i.e., A/C cooling or normal cooling, for the IPU 52 is selected, allowing the IPU 52 to be cooled appropriately.

The high-voltage equipment cooling system 10 for the electric vehicle according to the present invention is not limited to the embodiment described above, and it is a matter of course that various alternative or additional configurations could be adopted therein without deviating from the gist of the present invention as set forth in the appended claims.

What is claim is:

1. A high-voltage equipment cooling system for an electric vehicle, equipped with high-voltage equipment disposed in the electric vehicle driven by a motor, an air conditioner including an air cooling unit that cools air, a first air blower configured to supply air to the air conditioner, and a second air blower configured to supply air to the high-voltage equipment, the high-voltage equipment cooling system for the electric vehicle, comprising:

a control unit comprising a microcomputer and configured to control an air flow rate of the second air blower based on information about an air supply method for the high-voltage equipment, information about an air flow rate of the first air blower, selection information about which of indoor air circulation and outdoor air introduction is selected by the air conditioner, selection information about which air supply mode is selected by the air conditioner, and information about an air flow rate at which air is supplied to the high-voltage equipment.

2. The high-voltage equipment cooling system for the electric vehicle according to claim 1, wherein the control unit is configured to:

use a map associating the air flow rate of the first air blower with the air flow rate of the second air blower for each air supply mode corresponding to the indoor air circulation and for each air supply mode corresponding to the outdoor air introduction; and determine the air flow rate of the second air blower based on the air flow rate of the first air blower and the map.

3. The high-voltage equipment cooling system for the electric vehicle according to claim 2, further comprising a voltage sensor configured to detect a voltage of the first air blower, wherein the control unit is configured to interpret the voltage detected by the voltage sensor as the air flow rate of the first air blower.

4. The high-voltage equipment cooling system for the electric vehicle according to claim 1, wherein the information about the air supply method for the high-voltage equipment is either supply of air cooled by the air conditioner or supply of air inside a vehicle cabin.

\* \* \* \* \*